(12) United States Patent
Jung et al.

(10) Patent No.: US 9,972,492 B2
(45) Date of Patent: May 15, 2018

(54) METHOD OF DOPING SUBSTRATE (71) Applicant: ELECTRONICS AND TELECOMMUNICATIONS RESEARCH INSTITUTE, Daejeon (KR)

(72) Inventors: Moon Youn Jung, Daejeon (KR); Jisu Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 59 days.

(21) Appl. No.: 15/073,455

(22) Filed: Mar. 17, 2016

(65) Prior Publication Data
US 2016/0284548 A1 Sep. 29, 2016

(30) Foreign Application Priority Data

Mar. 26, 2015 (KR) .................. 10-2015-0042671
Jan. 13, 2016 (KR) .................. 10-2016-0004359

(51) Int. Cl.
*H01L 21/00* (2006.01)
*H01L 21/84* (2006.01)
*H01L 21/268* (2006.01)
*H01L 21/22* (2006.01)
*H01L 21/223* (2006.01)
*H01L 21/225* (2006.01)
*H01L 29/66* (2006.01)

(52) U.S. Cl.
CPC .......... *H01L 21/268* (2013.01); *H01L 21/223* (2013.01); *H01L 21/2225* (2013.01); *H01L 21/2254* (2013.01); *H01L 29/66568* (2013.01)

(58) Field of Classification Search
CPC ... H01L 27/1277; H01L 21/268; H01L 27/12; H01L 29/66757; H01L 21/2255; H01L 21/0237; H01L 21/02532; H01L 21/02672; H01L 21/02675; H01L 21/84; H01L 21/02; H01L 21/336; H01L 21/70
See application file for complete search history.

(56) References Cited

U.S. PATENT DOCUMENTS

| | | | |
|---|---|---|---|
| 7,504,325 B2 | 3/2009 | Koezuka et al. | |
| 8,309,389 B1* | 11/2012 | Alie | H01L 31/02363 438/57 |
| 2004/0110335 A1* | 6/2004 | Jyumonji | H01L 29/66757 438/202 |
| 2005/0003594 A1* | 1/2005 | Koezuka | H01L 27/1277 438/166 |

* cited by examiner

*Primary Examiner* — Charles Garber
*Assistant Examiner* — Abdulfattah Mustapha (57) ABSTRACT

Provided is a method of doping a substrate. The method includes providing the substrate, providing a target material on the substrate, and implanting a dopant of the target material into the substrate by providing a laser beam to the target material.

14 Claims, 12 Drawing Sheets

METHOD OF DOPING SUBSTRATE

CROSS-REFERENCE TO RELATED APPLICATIONS

This U.S. non-provisional patent application claims priority under 35 U.S.C. §119 of Korean Patent Applications No. 10-2015-0042671, filed on Mar. 26, 2015, and 10-2016-0004359 filed on Jan. 13, 2016, the entire contents of which are hereby incorporated by reference.

BACKGROUND

The present disclosure herein relates to a method of manufacturing a semiconductor, and more particularly, to a method of doping a substrate by implanting a dopant into the substrate.

As typical semiconductor doping methods, an ion implantation method and an ion plasma doping method are the most common methods. The ion implantation method is a method of implanting a dopant into a substrate by accelerating the dopant. The plasma ion implantation method is a method of implanting Electron Cyclotron Resonance (ECR) plasma ions of a dopant into the substrate. However, A dopant gas may have toxicity. Also, a high-cost dopant gas may lead to low productivity.

SUMMARY

The present disclosure provides a method of doping a substrate capable of implanting a dopant in a solid state.

The present disclosure also provides a method of doping a substrate having higher productivity.

An exemplary embodiment of the inventive concept provides a method of doping a substrate, the method including: providing the substrate; providing a target material on the substrate; and implanting a dopant of the target material into the substrate by providing a laser beam to the target material.

In an exemplary embodiment of the inventive concept, a method of doping a substrate includes: providing the substrate; and implanting a dopant into the substrate.

In an exemplary embodiment, the implanting the dopant may include implanting the dopant emitted from solid target material into the substrate by providing a laser beam to the target material having the dopant therein.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, preferred embodiments of the inventive concept will be described in detail with reference to the accompanying drawings. Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims. Like reference numerals refer to like elements throughout.

Terms used herein are not to limit the inventive concept, but to explain embodiments of the inventive concept. Herein, the terms of a singular form may include plural forms unless referred to the contrary. The meaning of "comprise" and/or "comprising" specifies a property, a region, a fixed number, a step, a process, an element and/or a component but does not exclude other properties, regions, fixed numbers, steps, processes, elements and/or components. Also, a laser beam, an electron beam, a width, wavelength, an optic axis, phase, interference, a spot size, or a cross-section in the specification may be understood in the sense of commonly used terms in the optical field. Since the disclosure is described according to preferred embodiments, reference numerals suggested by an order of the description are not necessarily limited to the order.

Figure 1:
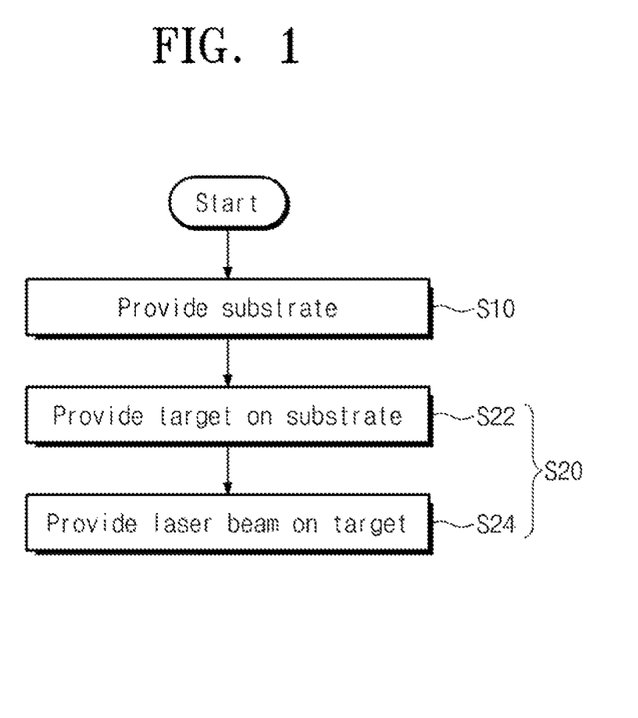
FIG. 1 is a flowchart showing a method of doping a substrate according to an exemplary embodiment of the inventive concept.
Figure 2:
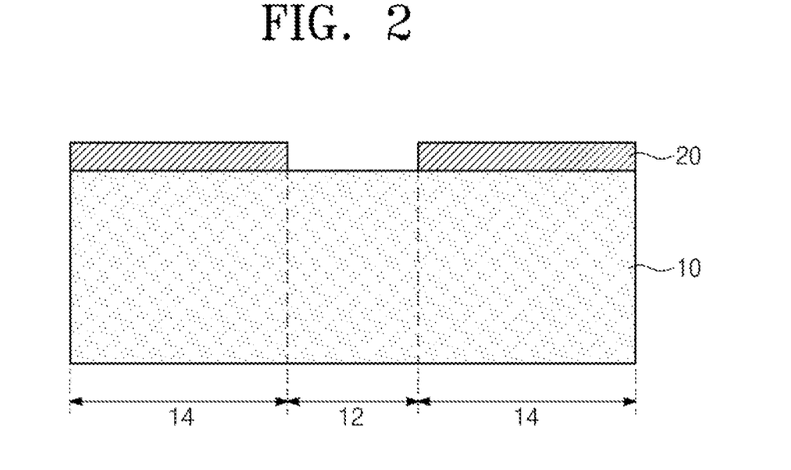
FIGS. 2 to 4 are process cross-sectional views of the substrate according to the substrate doping method shown in FIG. 1.
Figure 3:
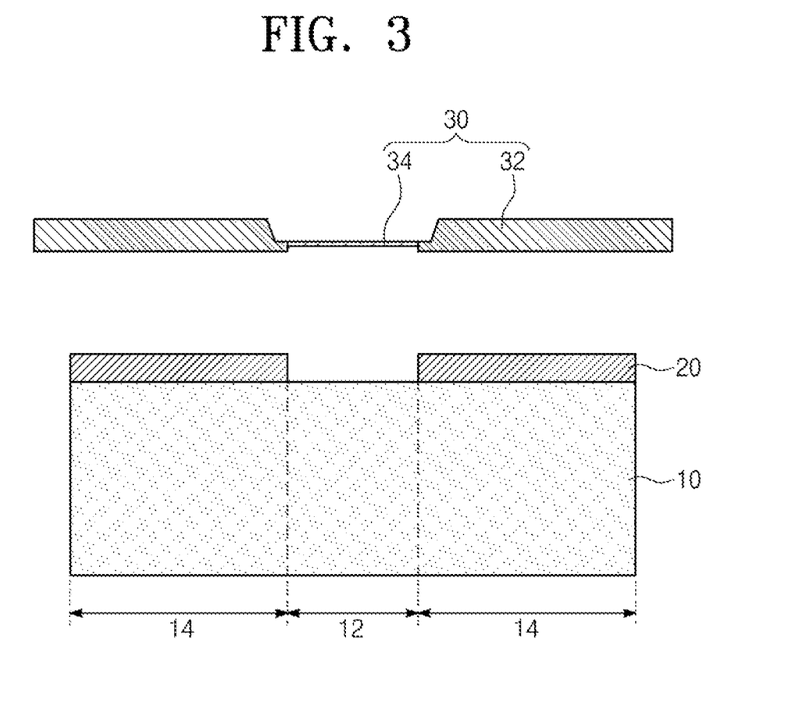
Figure 4:
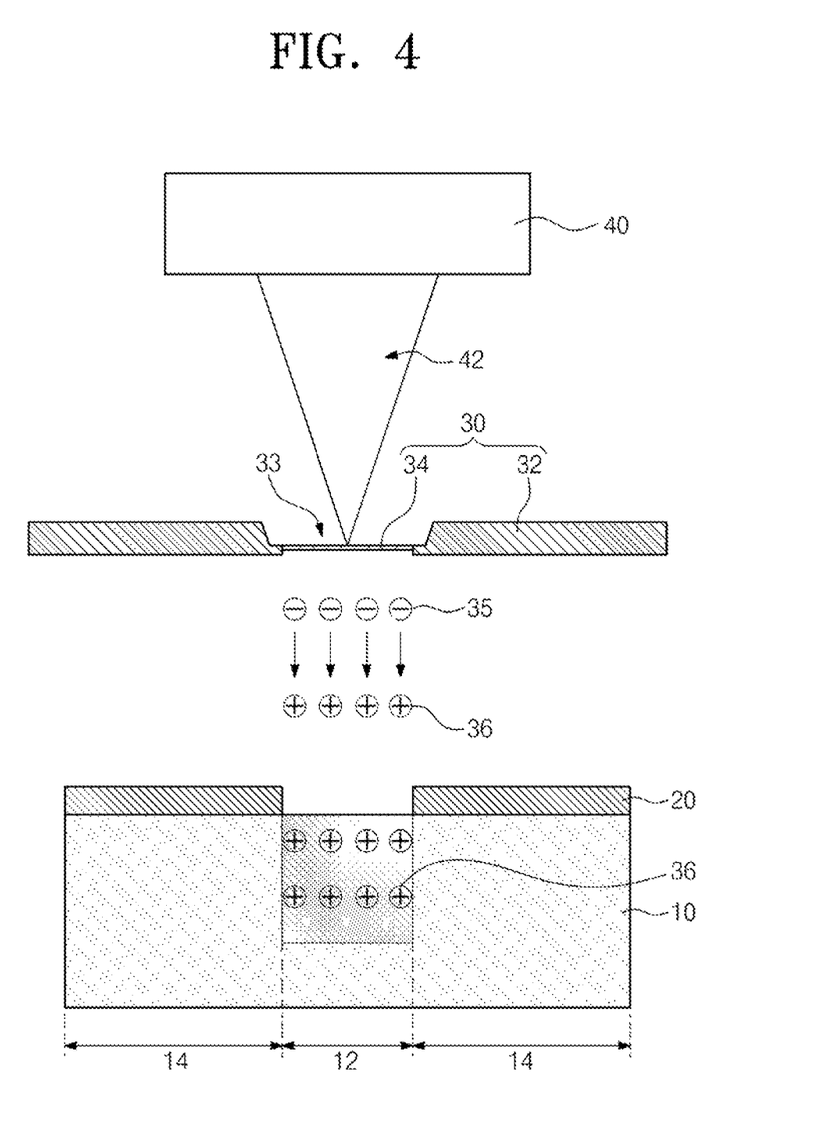

FIG. 1 is a flow chart showing a method of doping a substrate according to an exemplary embodiment of the inventive concept. FIGS. 2 to 4 are process cross-sectional views of a substrate 10 according to the substrate doping method shown in FIG. 1.

Referring to FIGS. 1 and 2, the substrate 10 is provided (S10). A mask pattern 20 may be formed on the substrate 10. The substrate 10 may have a doping region 12 and a closed region 14. The doping region 12 may be a region into which a dopant (36 of FIG. 4) is implanted. A top surface of the substrate 10 in the doping region 12 may be exposed from the mask pattern 20. The closed region 14 may be a region on which the mask pattern 20 is substantially formed. The top surface of the substrate 10 in the closed region 14 may be shielded by the mask pattern 20.

Referring to FIGS. 1, 3, and 4, the dopant 36 is implanted into the substrate 10 (S20). The implanting (S20) of the dopant 36 may include providing a target 30 on the substrate 10 (S22), and providing a laser beam 42 on the target 30 (S24).

Referring to FIGS. 1 and 3, the target 30 may be provided on the substrate 10 (S22). The target 30 may be disposed on and spaced from the substrate 10. The target 30 may include a support portion 32 and a first target material 34. The support portion 32 may have a window 33. The first target material 34 may be disposed within the window 33. The support portion 32 may hold the first target material 34. For example, the target material 34 may have a solid state unlike a dopant gas. The target material 34 in the solid state may have higher productivity than a high-cost dopant gas. According to an exemplary embodiment, the first target material 34 may be aligned on the doping region 12. The first target material 34 may have a thickness in a range from approximately several hundreds nm to approximately several thousands nm.

Referring to FIGS. 1 and 4, a laser apparatus 40 may provide the laser beam 42 on the target 30 (S24). For example, the laser apparatus 40 may include a femto second high-power laser apparatus or a pico second high-power laser apparatus. The first target material 34 may emit electrons 35 and the dopant 36 between the target 30 and the substrate 10. The dopant 36 may be provided into the substrate 10, breaking a binding force between molecules or atoms of the first target material 34. The dopant 36 may be accelerated toward the electrons 35 in the substrate 10. This may be explained by the Target-Normal Acceleration model. The dopant 36 may have the positive charge.

Figure 5A:
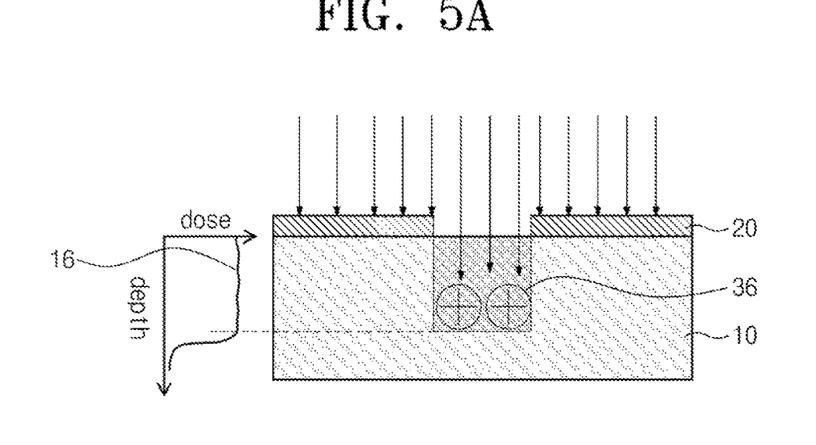
FIGS. 5A to 5C are views showing depth profiles of a dopant according to the dose of a laser beam of FIG. 4.
Figure 5B:
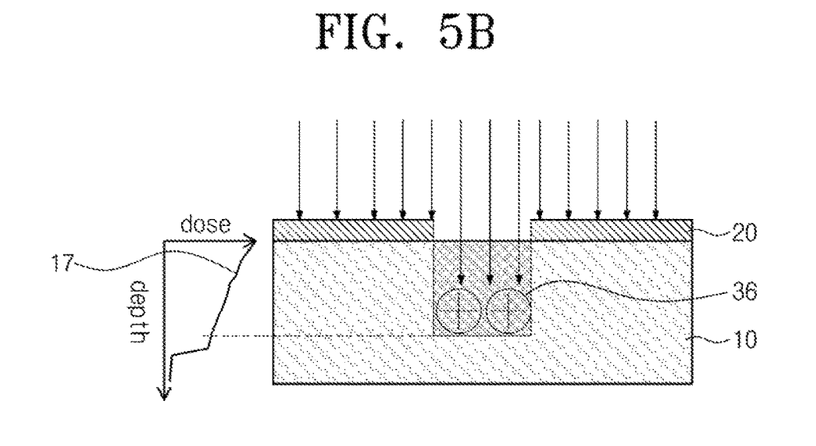
Figure 5C:
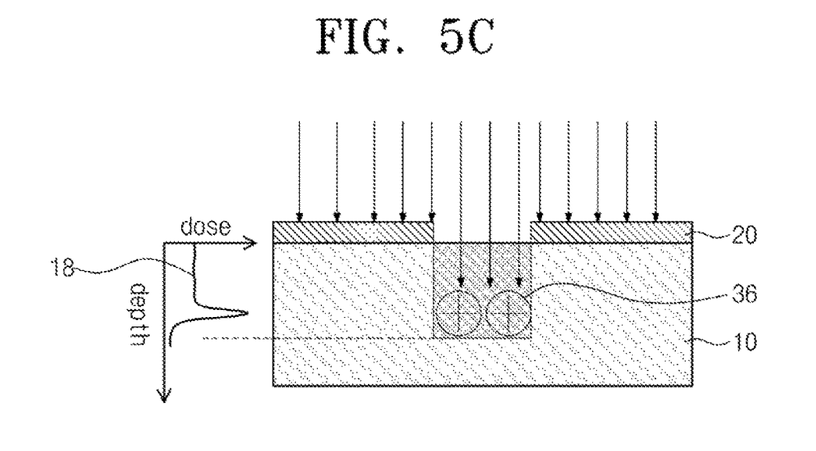

FIGS. 5A to 5C are views showing depth profiles of a dopant according to the dose of the laser beam of FIG. 4.

Referring to FIGS. 4 and 5A, when the dose of the laser beam 42 is constant, the dopant 36 may be implanted in a constant concentration to a predetermined depth from a surface of the substrate 10. For example, the dopant 36 may have a flat profile 16.

Referring to FIGS. 4 and 5B, when the dose of the laser beam 42 gradually decreases, the concentration of the dopant 36 may gradually decrease to a predetermined depth from the surface of the substrate 10. Meanwhile, when the dose of the laser beam 42 gradually increases, the concentration of the dopant 36 may gradually increase to a predetermined depth from the surface of the substrate 10. For example, the dopant 36 may have an oblique profile 17.

Referring to FIGS. 4 and 5C, when a high dose of the laser beam 42 is provided in a short period of time, the dopant 36 may be implanted at a higher concentration to a predetermined depth of the substrate 10. For example, the dopant 36 may have a peak profile 18.

Figure 6:
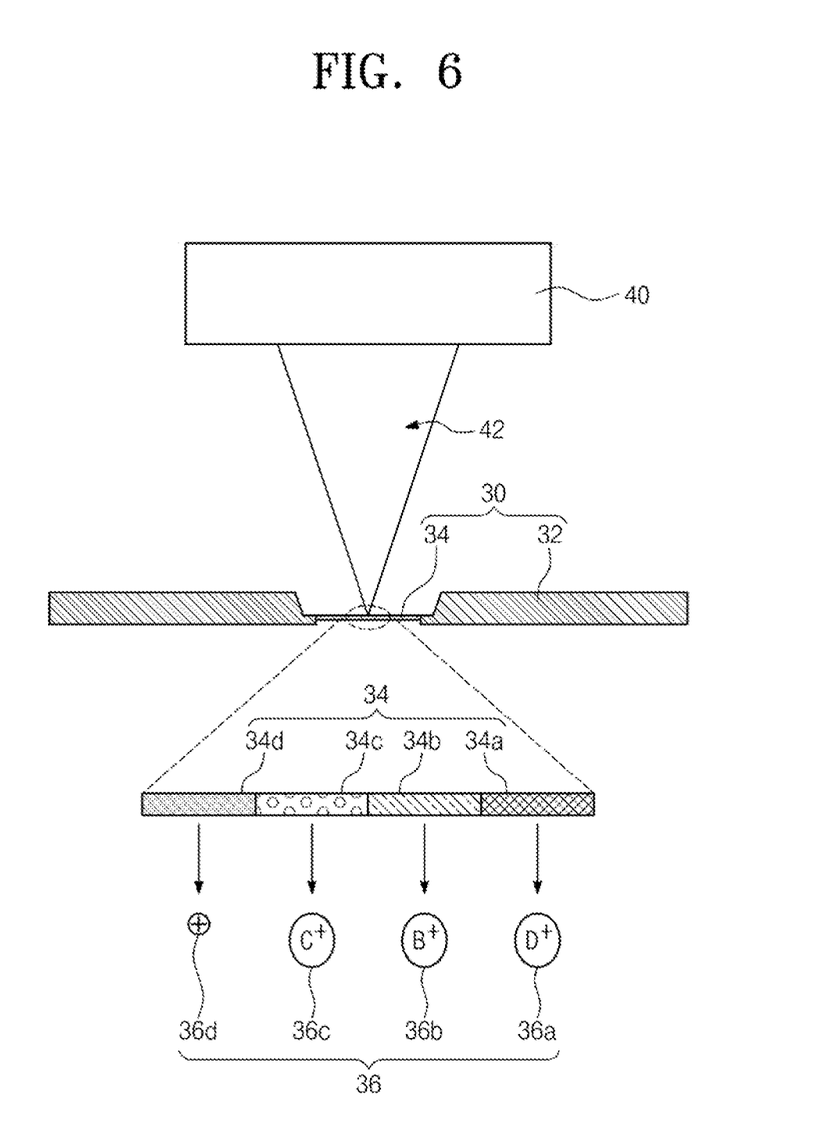
FIG. 6 is a view illustrating an exemplary target material of FIG. 4.

FIG. 6 is a view showing an example of the first target material 34 of FIG. 4.

Referring to FIG. 6, the first target material 34 may be formed with a plurality of regions by the type of the dopant 36. According to an exemplary embodiment, the first target material 34 may have first to fourth regions 34a to 34d. The first to fourth regions 34a to 34d may contain first to fourth dopants 36a to 36d, respectively. For example, the first to fourth dopants 36a to 36d may include phosphorus, boron, carbon, and proton, respectively. The laser apparatus 40 may provide an equal dose of the laser beam 42 to each of the first to the fourth regions 34a to 34d. Meanwhile, the laser beam 42 may be provided in a different dose to each of the first to fourth regions 34a to 34d.

Figure 7:
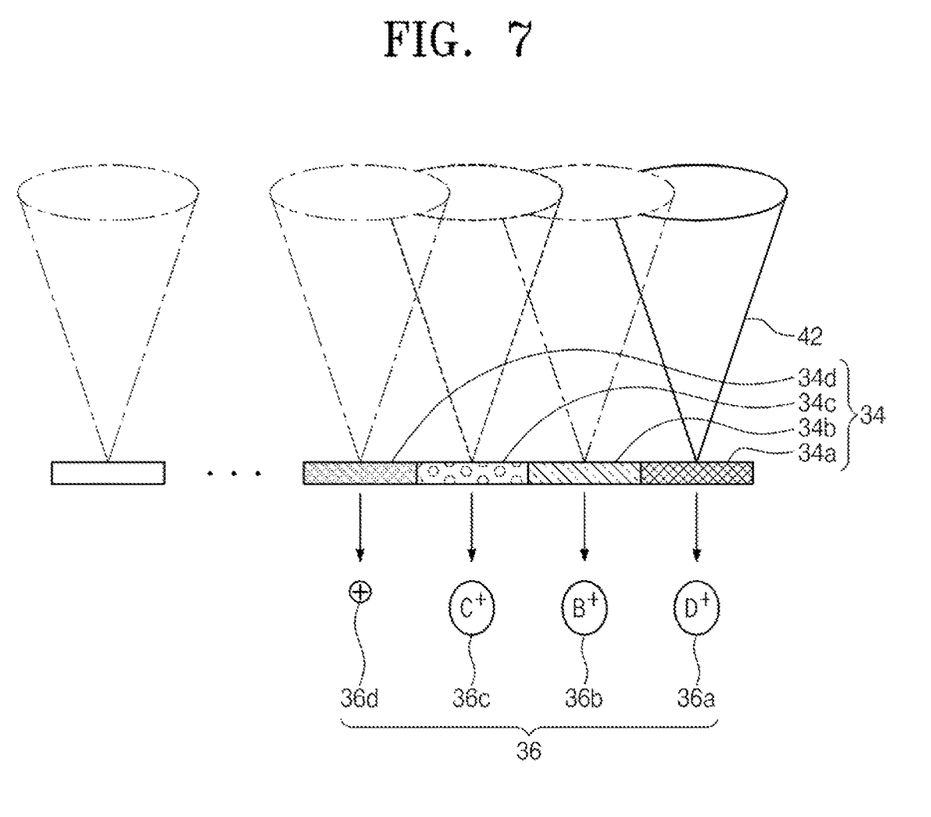
FIG. 7 is a view illustrating an emission process of first to fourth dopants according to a movement of the laser beam of FIG. 6.

FIG. 7 is a view illustrating emission processes of first to fourth dopants according to a movement of the laser beam of FIG. 6.

Referring to FIG. 7, when the laser beam 42 is provided to the first to fourth regions 34a to 34d in a sequential order, the first to fourth dopants 36a to 36d may be individually emitted.

FIGS. 8A to 8D are process cross-sectional views illustrating an example of the substrate doping method shown in FIGS. 2 to 3.

Figure 8A:
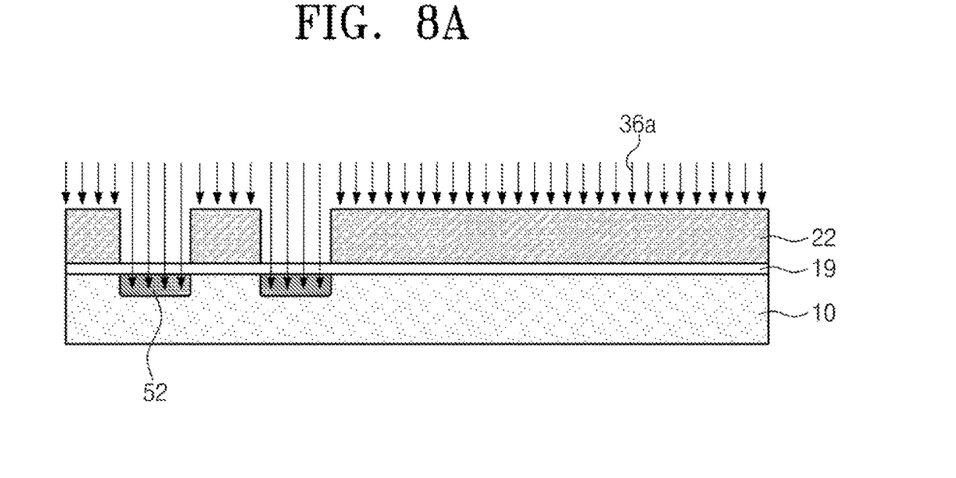
FIGS. 8A to 8D are process cross-sectional views illustrating an example of the substrate doping method shown in FIGS. 2 to 3.
Figure 8B:
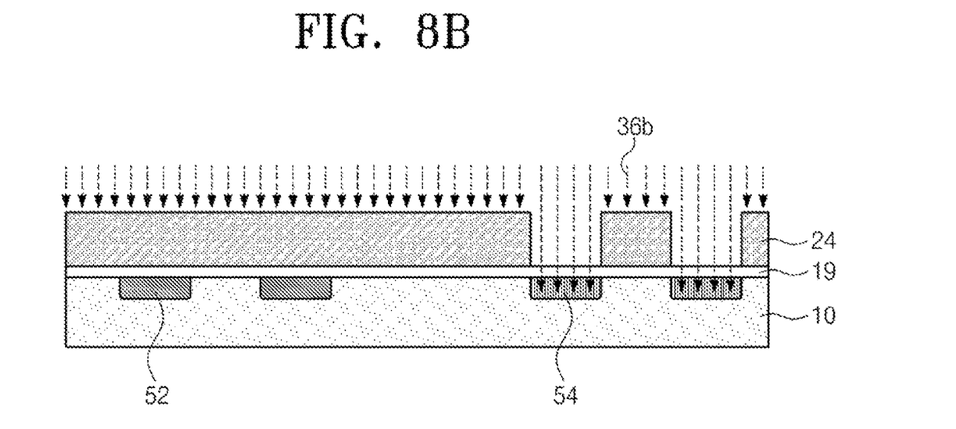
Figure 8C:
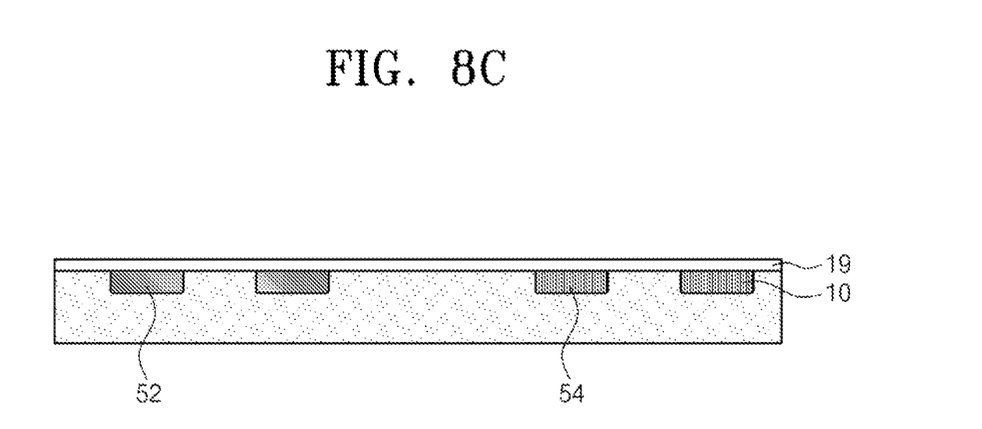
Figure 8D:
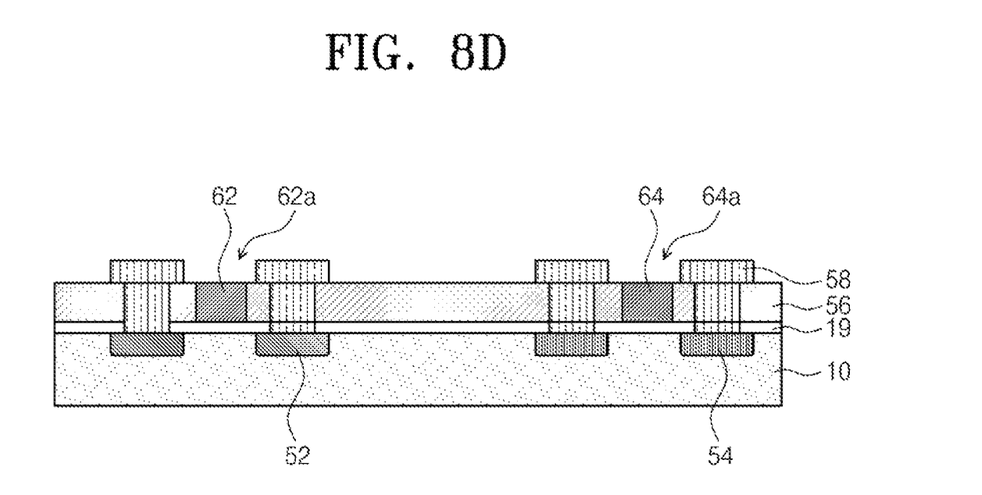
Figure 9:
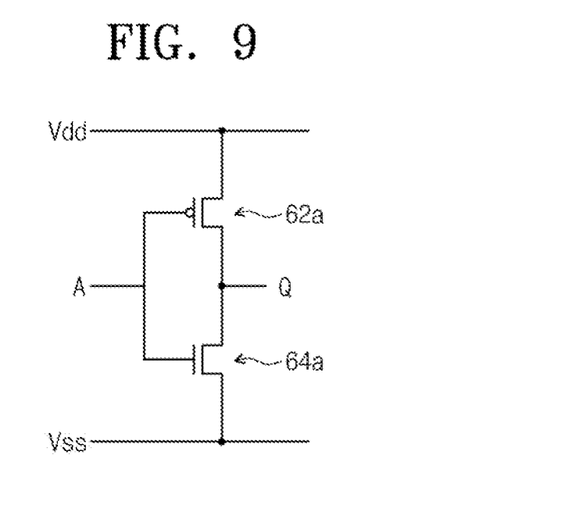
FIG. 9 is a circuit diagram of a semiconductor device to be formed by the substrate doping method shown in FIGS. 8A to 8D.

FIG. 9 is a circuit diagram of a semiconductor device to be formed by the substrate doping method shown in FIGS. 8A to 8D.

Referring to FIGS. 8A and 9, a gate insulation film 19 may be provided on a substrate 10. A first mask patter 22 may be provided on the gate insulation film 19. The first mask pattern 22 may expose a portion of the gate insulation film 19. A first dopant 36a may be implanted into the substrate 10 by through the gate insulation film 19. The first dopant 36a may form first dopant regions 52 in the substrate 10 along the first mask pattern 22. For example, the first dopant regions 52 may include a source and a drain of an NMOS transistor 62a, respectively. Then, the first mask pattern 22 may be removed.

Referring to FIGS. 8B and 9, a second mask pattern 24 may be provided on the gate insulation film 19. A second dopant 36b may be implanted into the substrate 10. The second dopant 36b may form second dopant regions 54 in the substrate 10 along the second mask pattern 24. For example, the second dopant regions 54 may include a source and a drain of a PMOS transistor 64a, respectively.

Referring to FIG. 8C, the second mask pattern 24 may be removed.

Referring to FIGS. 8D and 9, an interlayer insulation film 56 may be formed on the gate insulation film 19. Pad electrodes 58 may be formed on the first and second dopant regions 52 and 54 by passing through the interlayer insulation film 56 and the gate insulation film 19. A first gate electrode 62 may be formed in the interlayer insulation film 56 between the first dopant regions 52. Also, a second gate electrode 64 may be formed in the interlayer insulation film 56 between the second dopant regions 54. The NMOS transistor 62a may include the first dopant regions 52 and the first gate electrode 62. The PMOS transistor 64a may include the second dopant regions 54 and the second gate electrode 64.

Figure 10:
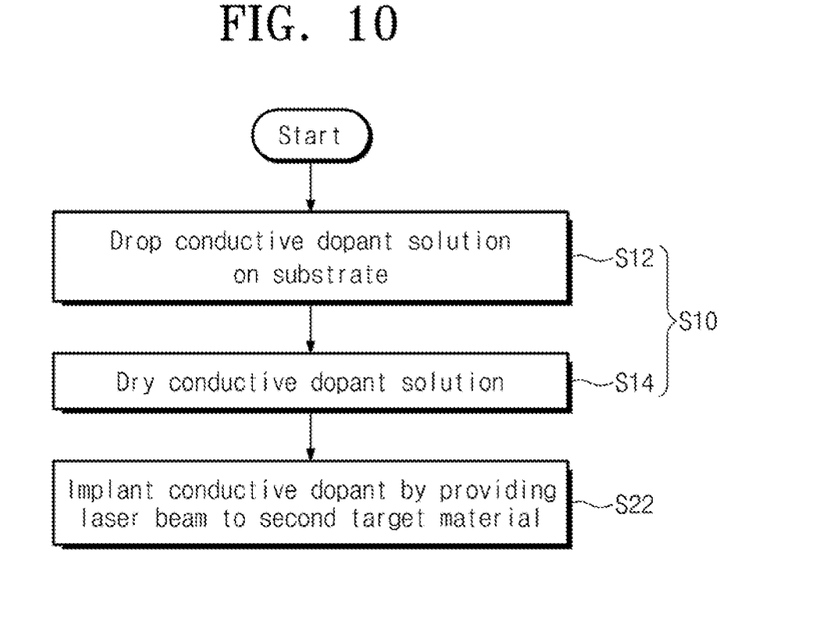
FIG. 10 is a flowchart showing a method of doping a substrate according to an exemplary embodiment of the inventive concept.
Figure 11:
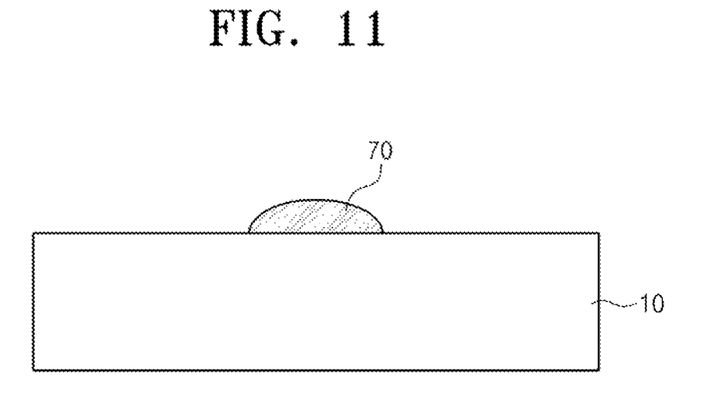
FIGS. 11 to 13 are process cross-sectional views illustrating the substrate doping method shown in FIG. 10.
Figure 12:
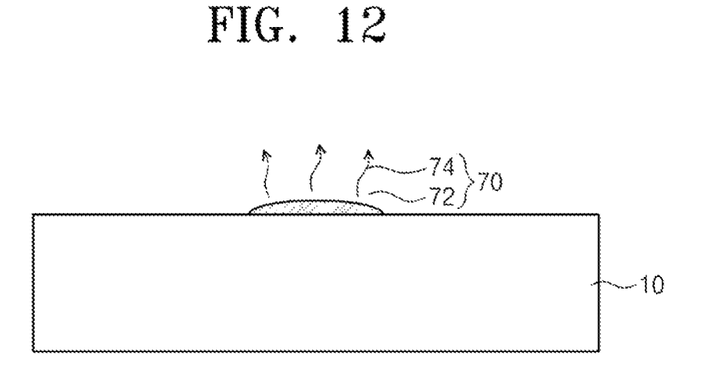
Figure 13:
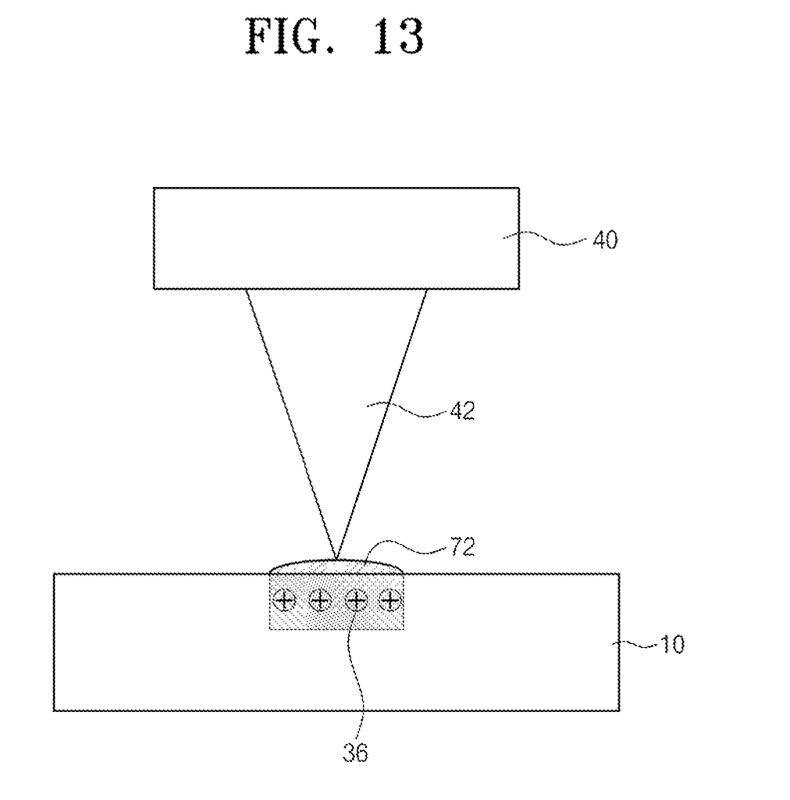

FIG. 10 is a flowchart showing a method of doping a substrate according to an exemplary embodiment of the inventive concept. FIGS. 11 to 13 are process cross-sectional views illustrating the substrate doping method shown in FIG. 10.

Referring to FIGS. 10 to 12, a substrate 10 is provided (S10). The providing (S10) the substrate 10 may include dropping a dopant solution 70 (S12) and drying the dopant solution 70 (S14).

Referring to FIGS. 10 and 11, the dopant solution 70 may be provided S12 on the substrate 10. For example, the dopant solution 70 may be dropped on the substrate 10 by a printing method.

Referring to FIGS. 10 and 12, the dopant solution 70 may be dried (S14). The dopant solution 70 may include a second target material 72 and a solvent 74. The second target material 72 may be a source of the dopant 36 to be implanted into the substrate 10. The solvent 74 may dissolve the second target material 72. The solvent 74 may be naturally dried or dried by heat. For example, the solvent 74 may include an alcohol, deionized water, or a supercritical material. The second target material 72 may have a solid state.

Referring to FIGS. 10 and 13, the laser apparatus 40 provides the laser beam 42 to the second target material 72 (S22). The laser beam 42 may generate electrons (not illustrated) and the dopant 36 from the second target material 72. The dopant 36 may be implanted into the substrate 10. Then, the second target material 72 may be removed.

Figure 14:
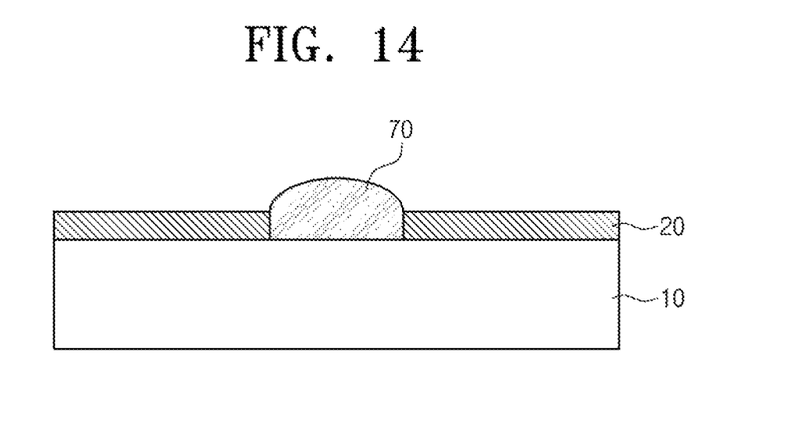
FIGS. 14 to 16 are process cross-sectional views illustrating the substrate doping method shown in FIG. 10.
Figure 15:
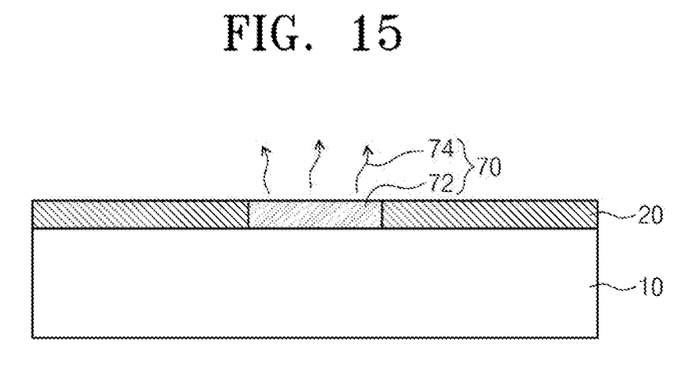
Figure 16:
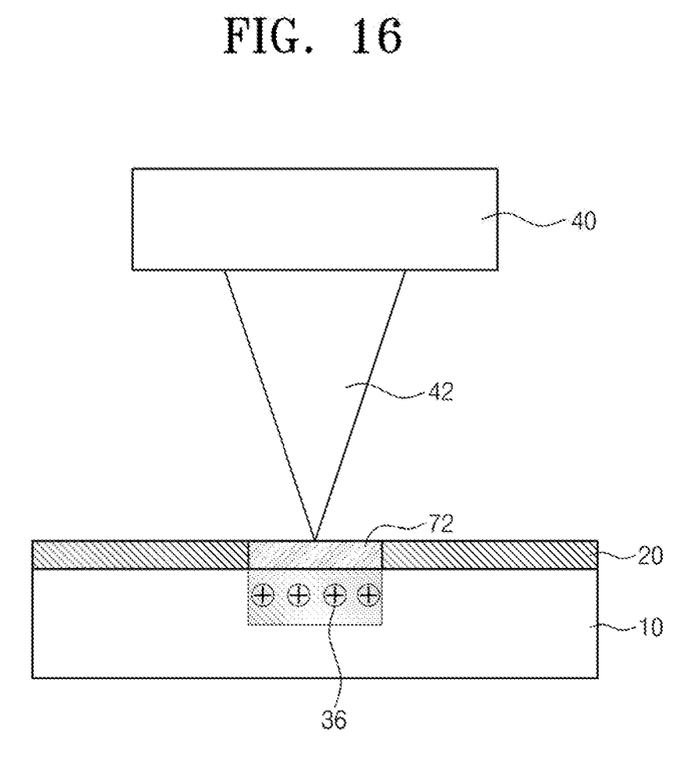

FIGS. 14 to 16 are process cross-sectional views illustrating an example of the doping method shown in FIG. 10.

Referring to FIGS. 10 and 14, the dopant solution 70 is dropped on the substrate 10 within the mask pattern 20 (S12). The mask pattern 20 may define a region on which the dopant solution 70 is dropped.

Referring to FIGS. 10 and 15, the dopant solution 70 is dried (S14) to form the second target material 72 in the mask pattern 20.

Referring to FIGS. 10 and 16, the laser beam 42 is provided to the second target material 72 in the mask pattern 20 (S22). The second target material 72 may emit the dopant 36 into the substrate 10. The mask pattern 20 may define a doping region of the dopant 36.

Then, the mask pattern 20 and the second target material 72 may be removed.

As described above, according to a method of doping a substrate according to exemplary embodiments of the inventive concept, a dopant emitted from a target material in a solid state by providing a laser beam to the target material may be implanted into a substrate. The target material in the solid state may have higher productivity than a high-cost dopant gas.

While this disclosure has been particularly shown and described with reference to preferred embodiments thereof, it will be understood by those skilled in the art that various changes in form and details may be made therein without departing from the spirit and scope of the inventive concept as defined by the appended claims. Therefore, it should be understood that the embodiments and applications disclosed herein are exemplified in all aspects, and should not be construed as limiting the technical idea of the inventive concept.

What is claimed is:

1. A method of doping a substrate, the method comprising:
    providing the substrate;
    providing a target material on the substrate, the target material being a solid material disposed in a window of a support portion, the support portion holding the target material; and
    implanting a dopant of the target material into the substrate by providing a laser beam to the target material when the target material is spaced apart from the substrate,
    wherein providing the laser beam to the target material includes accelerating the dopant toward the substrate.

2. The method of claim 1, wherein providing the substrate comprises forming a mask pattern that exposes a doping region of the substrate.

3. The method of claim 2, wherein providing the target material comprises providing a target on the substrate, the target including the target material, and
    wherein the target material is aligned on the doping region.

4. The method of claim 1, wherein providing the substrate comprises forming a mask pattern on the substrate.

5. A method of doping a substrate, the method comprising:
    providing the substrate; and
    implanting a dopant into the substrate,
    wherein implanting the dopant comprises providing a laser beam to a target material including the dopant when the target material is spaced apart from the substrate, the target material being a solid material,
    wherein the solid target material is disposed in a window of a support portion, the support portion holding the target material, and
    wherein providing the laser beam to the target material includes accelerating the dopant toward the substrate.

6. The method of claim 5, wherein implanting the dopant comprises:
    providing a target including the target material on the substrate; and
    providing the laser beam to the target material,
    wherein the dopant is implanted into the substrate at a depth proportional to an energy of the laser beam.

7. The method of claim 6, wherein the target material comprises a plurality of regions, each of the plurality of regions including a set of dopants, and
    wherein the plurality of regions includes a first region and a second region, the first region having a first set of dopants and the second region having a second set of dopants, the first and second sets of dopants having different conductivities from each other.

8. The method of claim 7, wherein each set of dopants comprises one or more of phosphorus, boron, carbon, and proton.

9. The method of claim 6, wherein providing the substrate comprises forming, on the substrate, a mask pattern that exposes a doping region of the substrate, and
    wherein the target material is aligned on the doping region.

10. The method of claim 5, wherein providing the substrate comprises forming a mask pattern on the substrate.

11. The method of claim 1, wherein implanting the dopant includes implanting a first type of dopant into the substrate by providing a laser beam to a first region of the target material, and implanting a second type of dopant into the substrate by providing the laser beam to a second region of the target material, the first region including the first type of dopant and the second region including the second type of dopant.

12. The method of claim 5, wherein implanting the dopant into the substrate includes implanting a first type of dopant into the substrate by providing a laser beam to a first region of the target material, and implanting a second type of dopant into the substrate by providing the laser beam to a second region of the target material, the first region including the first type of dopant and the second region including the second type of dopant.

13. The method of claim 1, wherein the substrate includes a doping region exposed by a mask pattern, and
    wherein the dopant of the target material is implanted into the doping region of the substrate.

14. The method of claim 5, wherein the substrate includes a doping region exposed by a mask pattern, and
    wherein the dopant of the target material is implanted into the doping region of the substrate.

* * * * *